United States Patent
Leao et al.

(10) Patent No.: US 9,194,958 B2
(45) Date of Patent: Nov. 24, 2015

(54) STABILIZED THALLIUM BROMIDE RADIATION DETECTORS AND METHODS OF MAKING THE SAME

(71) Applicant: Lawrence Livermore National Security, LLC, Livermore, CA (US)

(72) Inventors: Cedric Rocha Leao, Oakland, CA (US); Vincenzo Lordi, Livermore, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 29 days.

(21) Appl. No.: 14/044,743

(22) Filed: Oct. 2, 2013

(65) Prior Publication Data

US 2014/0097349 A1 Apr. 10, 2014

Related U.S. Application Data

(60) Provisional application No. 61/710,603, filed on Oct. 5, 2012.

(51) Int. Cl.
| | |
|---|---|
| *H01L 31/032* | (2006.01) |
| *G01T 1/16* | (2006.01) |
| *G01T 1/24* | (2006.01) |
| *C30B 15/04* | (2006.01) |
| *C30B 11/04* | (2006.01) |
| *C30B 13/10* | (2006.01) |
| *C30B 29/10* | (2006.01) |
| *C30B 11/06* | (2006.01) |
| *C30B 29/12* | (2006.01) |
| *H01L 31/08* | (2006.01) |

(52) U.S. Cl.
CPC . *G01T 1/16* (2013.01); *C30B 11/04* (2013.01); *C30B 11/06* (2013.01); *C30B 13/10* (2013.01); *C30B 15/04* (2013.01); *C30B 29/10* (2013.01); *C30B 29/12* (2013.01); *G01T 1/24* (2013.01); *H01L 31/0321* (2013.01); *H01L 31/085* (2013.01)

(58) Field of Classification Search
CPC .................................................. H01L 31/0321
See application file for complete search history.

(56) References Cited

U.S. PATENT DOCUMENTS

2012/0153295 A1* 6/2012 Tuller et al. ............... 257/76

OTHER PUBLICATIONS

Cedric R. Leão and Vincenzo Lordi, "Simultaneous Control of Ionic and Electronic Conductivity in Materials: Thallium Bromide Case Study." Phys. Rev. Lett. 108, 246604 (2012) 5 pages. <doi: 10.1103/PhysRevLett.108.246604> published Jun. 15, 2012.*
Bishop et al., "The Defect and Transport Properties of Donor Doped Single Crystal TlBr," Journal of the Electrochemical Society, vol. 158, No. 2, 2011, pp. J47-J51, doi-10.1149/1.352543.

(Continued)

*Primary Examiner* — Constantine Hannaher
(74) *Attorney, Agent, or Firm* — Zilka-Kotab, PC

(57) ABSTRACT

According to one embodiment, a crystal includes thallium bromide (TlBr), one or more positively charged dopants, and one or more negatively charged dopants. According to another embodiment, a system includes a monolithic crystal including thallium bromide (TlBr), one or more positively charged dopants, and one or more negatively charged dopants; and a detector configured to detect a signal response of the crystal.

20 Claims, 4 Drawing Sheets

(56) References Cited

OTHER PUBLICATIONS

Gazizov et al., "The Sensitivity of Pure and Doped TlBr Crystals," 2010 IEEE, pp. 3704-3708, doi=10.1109/NSSMIC.2010.5874504.

Smith et al., "Electronic effects of Se and Pb dopants in TlBr," 2012 American Institute of Physics, Applied Physics Letters, vol. 100, 2012, pp. 202102/1-202102/4, online May 14, 2012 doi=10.1063/1.4712596.

* cited by examiner

STABILIZED THALLIUM BROMIDE RADIATION DETECTORS AND METHODS OF MAKING THE SAME

RELATED APPLICATIONS

This application claims priority to Provisional U.S. Appl. No. 61/710,603 filed on Oct. 5, 2012, which is herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to simultaneously tuning electronic and ionic conductivity in materials that find application in a variety of electronic devices. More particularly, this invention relates to stabilized thallium bromide crystals configured for use as radiation detectors and methods of making the same.

BACKGROUND

Radioactive materials are often detected and identified by measuring the energy spectrum of radiation (e.g. gamma rays, x-rays, neutrons, etc.) that they emit. The spectrum of energy of the emitted radiation is specific to that particular material and thus acts as a "fingerprint" to identify the material.

The ability to detect gamma rays and/or neutrons is a vital tool for many areas of research. For example, gamma-ray/neutron detectors allow scientists to study celestial phenomena and diagnose medical diseases. Additionally, these detectors are important tools for homeland security, helping the nation confront new security challenges. The nuclear nonproliferation mission requires detectors capable of identifying diversion of or smuggling of nuclear materials. Government agencies need detectors for scenarios in which a terrorist might use radioactive materials to fashion a destructive device targeted against civilians, structures, or national events.

Thallium Bromide (TlBr) has emerged as a promising wide-bandgap semiconductor crystal suitable for room temperature radiation detection. However, radiation detectors comprising TlBr, despite presenting high resolution and accuracy, invariably degrade after operation times ranging from mere hours to months. This degradation is typically attributed to the polarization of the crystal due to the accumulation of oppositely charged Tl+ and Br− ions in the TlBr crystal under an applied bias. Ionic movement in the TlBr crystal is mediated mostly by Tl and Br vacancies, which occur naturally in the intrinsic or pristine material in quantities that vary according to the temperature. These intrinsic positively and negatively charged vacancies are generated in equal proportions and are called Schottky pairs. Vacancies can also be induced extrinsically via doping with a charged impurity. In order to maintain charge neutrality, additional oppositely charged vacancies will be generated in response to these impurities. When an electric field is applied to TlBr, not only photo-excited electrons, but also ions start to move towards the electric contacts. The greater the quantity of vacancies, the larger the ionic current will be. Ultimately, the resulting imbalance in the distribution of charged ions produces an internal electric field that opposes the direction of the applied bias, thereby decreasing the collection of charge carriers and thus degrading the spectroscopic performance, e.g. the signal energy resolution, of TlBr crystals.

Several conventional techniques for reducing the degradation (e.g. reducing the polarization) and increasing the stability of TlBr crystals have been attempted. One approach is to cool the TlBr crystal down to about −20° C. or lower, which serves to decrease the ion mobilities. In addition to increasing the operation costs of the device due to the need of sustaining this low temperature, TlBr still experiences the temporal degradation observed at room temperature, although over a longer time frame.

Other attempted approaches to improve performance and stable operation of a TlBr crystal include: applying Tl metal contacts to the TlBr crystal: periodically reversing the bias field (e.g. roughly every 24 hours); ultrapurification of TlBr crystal samples; and mechanical and/or chemical surface treatment of the TlBr crystal. However, these conventional techniques are also associated with several disadvantages. For instance, the use of Tl metal contacts may be unfavorable, as Tl metal is highly toxic, reactive with elements in the environment, and may be readily absorbed through the skin. Moreover, periodic switching of the bias fields adds to the complexity and cost of the circuitry, and may not be compatible with single carrier charge sensing techniques. Moreover still, ultrapurification of TlBr crystal samples may both time expensive and time-consuming.

Thus, while the above conventional techniques may increase the operational lifetime of TlBr crystals employed for radiation detection, none have achieved a long lasting solution to the degradation observed in TlBr radiation detectors. New approaches are therefore needed make possible the large scale application of TlBr as an economically viable radiation detector material.

Accordingly, it would be beneficial to provide systems and methods for stabilizing TlBr crystals without suffering from the drawbacks associated with the conventional techniques described above.

SUMMARY

According to one embodiment, a crystal includes thallium bromide (TlBr), one or more positively charged dopants, and one or more negatively charged dopants.

According to another embodiment, a system includes a monolithic crystal including thallium bromide (TlBr), one or more positively charged dopants, and one or more negatively charged dopants; and a detector configured to detect a signal response of the crystal.

According to yet another embodiment, a method includes forming a monolithic crystal including thallium bromide, one or more positively charged dopants, and one or more negatively charged dopants.

Other aspects and embodiments of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, reference should be made to the following detailed description read in conjunction with the accompanying drawings.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

As additionally used herein, the term "about" when combined with a value refers to ±10% of the reference value. For example, a temperature of about 50° C. refers to a temperature of 50° C.±5° C., etc.

Further, the term "co-dopants" as used in various approaches refers to at least two dopants, preferably having opposite charges.

Figure 1:
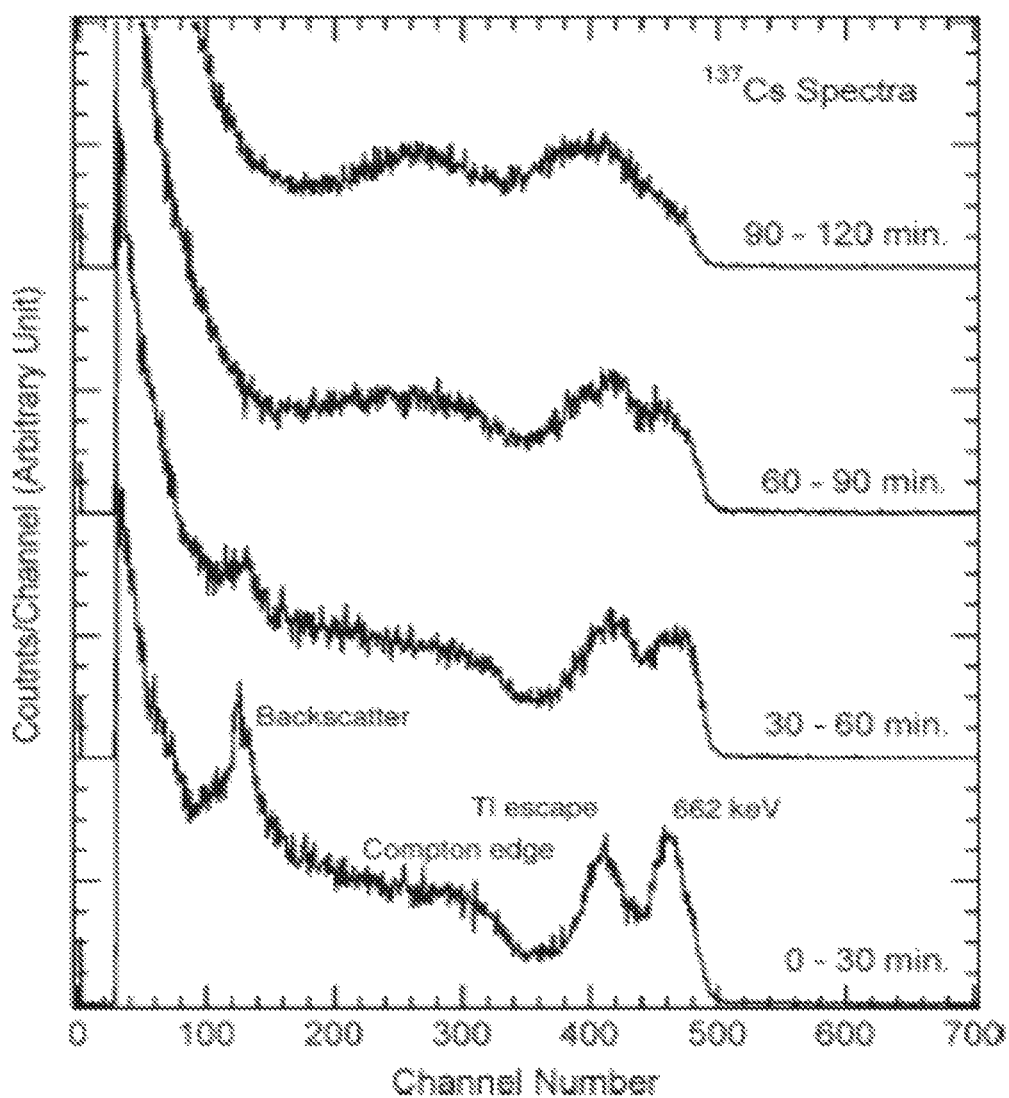
FIG. 1 shows a spectrum of TlBr illustrating the loss of signal resolution over time, according to one embodiment.

As noted above, thallium bromide (TlBr) is a wide-bandgap semiconductor crystal considered to be particularly promising for room temperature radiation detection of, for example, X-rays, gamma rays, etc. However, despite its excellent spectroscopic performance (e.g. high resolution and accuracy), TlBr crystals invariable degrade over time, from what is believed to be due to the accumulation of oppositely charged species in the TlBr crystals under an applied bias. FIG. 1 depicts a spectrum of TlBr illustrating the loss of signal resolution over time. The migration of the oppositely charged species in TlBr crystals, and thus the ionic current, is facilitated by vacancy hopping.

Figure 2:
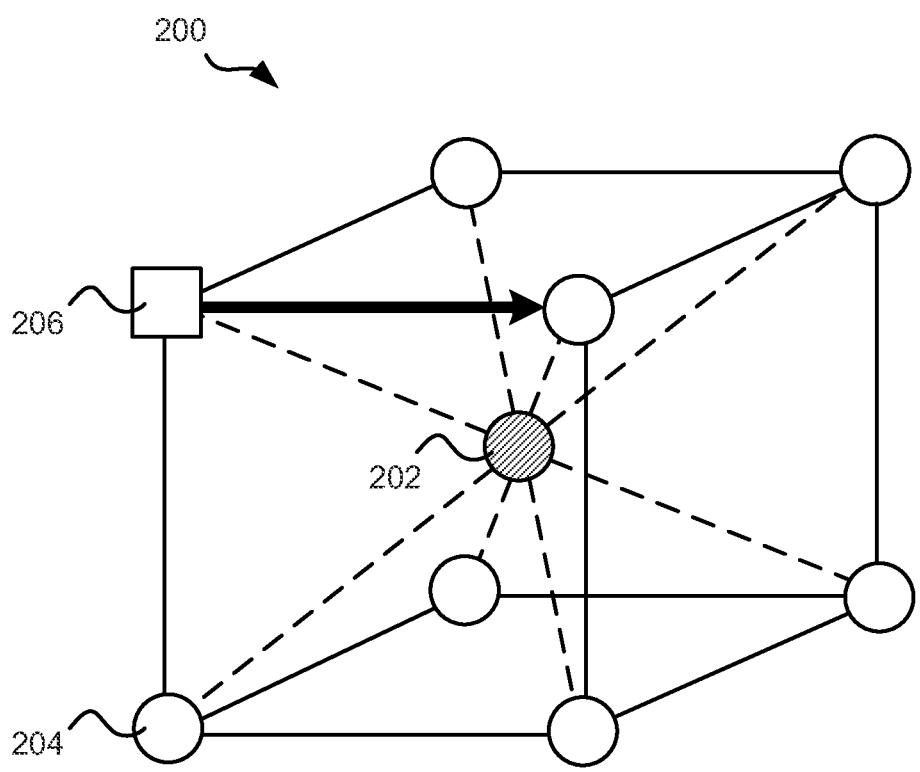
FIG. 2 shows a simplified representation of a unit cell of a generic ionic crystal having a cubic CsCl type crystalline structure, and the mechanism of vacancy hopping therein.

FIG. 2 shows a simplified representation of a unit cell 200 of a generic ionic crystal having a cubic CsCl type crystalline structure, and the mechanism of vacancy hopping therein, according to one embodiment. Per the arrangement shown in FIG. 2, a cation 202 occupies the position at the center of the cubic unit cell 200 of the crystal, whereas anions 204 occupy lattice points at the edges of the cubic unit cell 200. It is important to note that an alternate representation of this unit cell may have the positions of the cation and anions interchanged, such that the anion would occupy the position at the center of the unit cell and cations would occupy the lattice points at the edges of the unit cell. As shown in FIG. 2, an anion is missing from the crystal, thereby resulting in a vacancy 206 having an overall positive charge relative to the crystal lattice. This vacancy may migrate (e.g. as shown by the arrow) when a nearby ion jumps to its site, thus swapping positions under an applied bias, thereby contributing to the ionic current in the crystal.

The imbalance in the distribution of charged vacancies under an applied bias ultimately produces an internal electric field that opposes the direction of the applied bias, which is believed to be responsible for the degradation of the spectroscopic performance of these TlBr crystals.

Conventional techniques to circumvent and/or reduce the degradation of TlBr crystals include cooling down TlBr crystals to about −20° C. or lower during their use in radiation detection; applying Tl metal contacts to TlBr crystals; periodically reversing the bias field (e.g. roughly every 24 hours); ultrapurification of TlBr crystal samples; mechanical and/or chemical surface treatment of the TlBr crystal. However these techniques do not result in a permanent solution to the degradation and are associated with several drawbacks (e.g. prone to being power intensive and/or cost prohibitive, etc.).

Additionally, introduction of a single species of a charged defect (e.g. a positive defect or a negative defect) creates an excess of charge in the TlBr crystals, and thus induces the formation of new oppositely charged vacancies in order to maintain charge neutrality. Accordingly, doping TlBr crystals with a single species of a charged defect actually enhances the overall ionic conductivity in the TlBr crystals relative to the ionic conductivity in pristine ("undoped") TlBr crystals.

Embodiments disclosed herein overcome the aforementioned drawbacks by providing novel systems and methods for stabilizing thallium bromide crystals configured for use as radiation detectors. For instance, in preferred approaches, a crystal comprising thallium bromide may be co-doped with comparable and/or equal amounts of oppositely charged supervalent dopants (e.g. positively and negatively charged dopants). The addition of oppositely charged co-dopants avoids the undesirable formation of new vacancies in the TlBr crystal associated with the addition of a single dopant and/or a plurality of dopants that result in an excess of charge in the TlBr crystal. Further, the addition of oppositely charged co-dopants can effectively neutralize ("lock") the intrinsic and extrinsic Tl and Br vacancies, as each added positively charged dopant and each added negatively charged dopant may form stable, neutral complexes with a Tl vacancy and a Br vacancy, respectively. Accordingly, the resulting stable, neutral complexes will not move when the electric field is applied unless there is sufficient energy to overcome the electrostatic attraction that binds such complexes. As a result, there will be a significant reduction and/or elimination of the ionic mobility in the TlBr crystal. Addition of oppositely charged co-dopants can thus improve the TlBr crystal's stability during the operation of any device in which a bias field is needed and ionic current is detrimental (such as a radiation detector device) in a more efficient manner and at lower operational costs than cooling the TlBr crystal during use, employing expensive purification processes, or periodically reversing the applied bias field.

Moreover, in various preferred approaches, addition of the co-dopants to the TlBr crystal does not negatively impact/alter the electronic properties of crystal that are responsible for TlBr acting as a high-performance radiation detector. Electronic properties of the crystal may include, but are not limited to charge carrier lifetime, charge carrier mobility, etc. and other such electronic properties as would be understood by one having ordinary skill in the art upon reading the present disclosure.

Accordingly, in an exemplary approach, the ionic and electronic properties (e.g. conductivities) of the TlBr crystal may be simultaneously tuned via careful selection and addition of one or more co-dopants thereto. The general ability to simultaneously tune the electronic and ionic conduction of materials can be useful in applications such as, but not limited to, electrodes for ion batteries, in which both conductivities should be ideally maximal, or also, but not limited to, solid electrolytes in fuel cells, in which ionic conductivity should be maximized and electronic current suppressed. Thus, administration of carefully chosen dopants (such as those disclosed herein) can achieve these goals in any combination desired (e.g. suppressing both ionic and electronic conductivity, maximizing both ionic and electronic conductivity, suppressing ionic conductivity and maximizing electronic conductivity, etc.), as would be understood by one having skill in the art upon reading the present disclosure.

In additional preferred approaches, the co-dopant may comprise lead (Pb) in combination with at least one of: sulfur (S) or selenium (Se). Tellurium (Te) is another possible co-dopant in conjunction with Pb, but imparts inferior electronic properties to the crystal, which may render radiation detection less effective. Other elements in the same group of the periodic table as Pb may also be used, but may be less practical.

Following are several examples of general and specific embodiments of a stabilized crystal comprising TlBr configured for radiation detection and/or related systems and methods.

According to one general embodiment, a crystal includes thallium bromide (TlBr). one or more positively charged dopants, and one or more negatively charged dopants.

According to another general embodiment, a system includes a monolithic crystal including thallium bromide (TlBr), one or more positively charged dopants, and one or more negatively charged dopants; and a detector configured to detect a signal response of the crystal.

According to yet another general embodiment, a method includes forming a monolithic crystal including thallium bromide, one or more positively charged dopants, and one or more negatively charged dopants.

Figure 3:
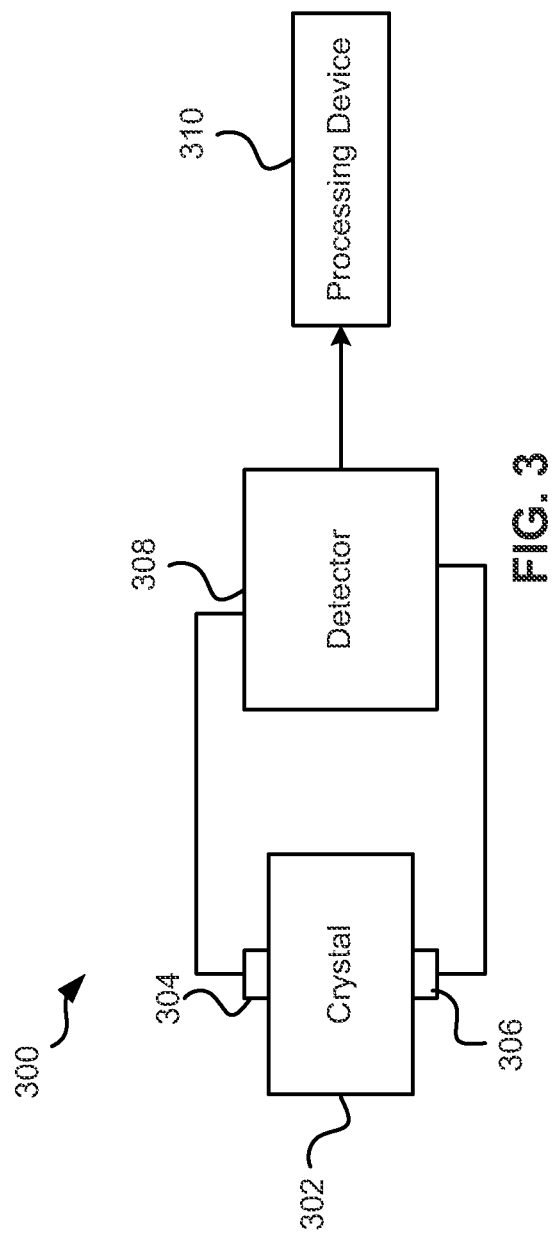
FIG. 3 shows a system, according to one embodiment.

Referring now to FIG. 3, a system 300 is shown according to one embodiment. As an option, the system 300 may be implemented in conjunction with features from any other embodiment listed herein, such as those described with reference to the other FIGS. Of course, the system 300 and others presented herein may be used in various applications and/or in permutations which may or may not be specifically described in the illustrative embodiments listed herein. Further, the system 300 presented herein may be used in any desired environment.

As shown in FIG. 3, the system 300 includes a crystal 302 comprising thallium bromide (TlBr), one or more positively charged dopants, and one or more negatively charged dopants. In some approaches, the crystal 302 may be a monolithic crystal. A "monolithic crystal" (also referred to herein as a "single crystal") denotes a discrete body of material characterized by a crystal lattice that is substantially continuous and unbroken to the edges of the material (e.g. is substantially free of grain boundaries and/or inclusions) in some approaches. Stated another way, a monolithic crystal denotes a discrete body of material comprising a substantially uniform crystalline phase. As used herein, the term "substantially" in various approaches refers to at least greater than 80%, at least greater than 85%, at least greater than 90%, at least greater than 95%, or, preferably, greater than 99% the stated condition, property, and/or effect.

In numerous approaches, a monolithic crystal may be obtained, for example, by cutting from a monolithic crystal ingot (or boule) grown from a melt via a suitable crystal fabrication technique known in the art. In other approaches, it may be preferably to utilize an entire monolithic crystal ingot (or boule) as grown and/or pieces having suitable geometric configurations and/or lengths cut therefrom.

In yet other approaches, a monolithic crystal is a crystal comprising a size effective for use as a semiconductor material. For example, in preferred approaches, the monolithic crystals described herein may comprise a volume of at least about 1 cm$^3$.

The above defined monolithic crystals are to be distinguished from powdered and/or polycrystalline materials comprising a plurality of small crystalline particles (or grains). While each of these individual crystalline particles/grains may be considered a monolithic or single crystal, their small size (e.g. typically on the order of several nanometers to tens of microns) precludes their useful/effective application in radiation detectors, and thus does not fall within the definition of a monolithic crystal as used herein.

As also shown in FIG. 3, the system 300 may include a first electrode 304 coupled to a first region of the crystal 302 and a second electrode 306 coupled to a second region of the crystal 302. While FIG. 3 shows the first and second electrodes coupled to regions on opposite sides of the crystal, it is important to note that the configuration of these electrodes is not limited to this arrangement. For instance, in other configurations, the first and second electrodes may be coupled to first and second regions, respectively, that are on the same side/surface of the crystal.

A potential between about 100 V to about 5,000 V may be applied (e.g. via a power supply, not shown in FIG. 3) across the first and second electrodes, thereby generating an electric field within the crystal 302, in various approaches.

As additionally shown in FIG. 3, the system 300 includes a detector 308 configured to detect and/or measure a signal response of the crystal 302 upon exposure of the crystal 302 to radiation (e.g. gamma radiation, X-ray radiation, etc.). For example, an incoming quantum of radiation may transfer energy to the electrons in the crystal 302, thereby creating electron-hole pairs (charge carriers) that may be separated via an externally applied electric field. The resulting electrical current may then be detected by the detector 308. The magnitude of the resulting electric current may further be analyzed to determine the energy of the incident radiation. As noted previously, the energy spectrum of such incident radiation is typically specific to a particular material and thus acts as a "fingerprint" by which to identify the material.

In some embodiments, the system 300 may optionally comprise, or be coupleable/coupled to, a processing device 310 for processing the resulting electric pulses output by the detector 308. In other embodiments, the system 300 may include a processing device that receives data from a detector that is not permanently coupled to the processing device. Illustrative processing devices may include but are not limited to microprocessors, field programmable gate arrays (FPGAs), application specific integrated circuits (ASICs), computers, analog-to-digital converters, etc.

The result of the processing may be output and/or stored in numerous approaches. For example, the result may be displayed on a display device in any form, such as in a histogram or derivative thereof.

Detection sensitivity for radiation sources and rapid, unambiguous isotope identification is principally dependent on the energy resolution of the system employed for radiation detection. Energy resolution can be stated in absolute or relative terms. For consistency, energy resolution of systems employed for radiation detection, e.g. system 300, is stated in relative terms herein. A common way of expressing energy resolution is with reference to the Full Width at Half Maximum (FWHM), which equates to the width of a radiation peak (e.g. a gamma ray, an x-ray, etc.) on a spectral graph at half of the highest point of a peak at a given energy.

The relative resolution of a system may be calculated by taking the absolute resolution, usually reported in keV, dividing by the actual energy of the radiation also in keV, and multiplying by 100%. This results in a resolution reported in percentage at a specific radiation energy.

In preferred embodiments, the crystal 302 as shown in FIG. 3 may have an energy resolution of less than about 2% at 662 keV. In some embodiments, the crystal 302 may have an energy resolution less than about 1% at 662 keV. In more embodiments, the crystal 302 may have an energy resolution in a range between about 2% to about 0.8% at 662 keV. In even more embodiments, the crystal 302 may maintain an energy resolution of less than about 2% at 662 keV for an extended time period, such as about several months.

As noted above, the crystal 302 includes TlBr, one or more positively charged dopants, and one or more negatively charged dopants. In some approaches, the one or more positively charged dopants and the one or more negatively charged dopants may alter or maintain/preserve one or more characteristics (e.g. ionic conductivity, charge carrier lifetime, charge carrier mobility, presence or absence of deep intra-gap levels, scattering properties, etc.) of the monolithic crystal 302. For instance, in various approaches the presence of suitable co-dopants (e.g. the one or more positively charged dopants and the one or more negatively charged dopants) in the monolithic crystal 302 may alter and/or compensate for the effects of intrinsic defects (Schottky defects), and extrinsic defects (particularly unintentional impurities) that may be introduced during the formation of the crystal 302 using known processes.

According to one exemplary embodiment, the one or more positively charged dopants and the one or more negatively charged dopants present in the crystal 302 may alter, such as by reducing and/or eliminating, the ionic conductivity of the crystal 302. As discussed previously, a TlBr crystal absent/devoid of extrinsic defects (e.g. dopants intentionally and/or unintentionally added to and/or present in the crystal) typically exhibits ionic conductivity at room temperature. This ionic conductivity is due to the movement of charged atoms, or ions, in the TlBr crystal under an applied bias. For example, at room temperature, a TlBr crystal comprises intrinsic Tl vacancies ($V_{Tl}^{/}$) and Br vacancies ($V_{Br}^{\cdot}$), where $V_{Tl}^{/}$ and $V_{Br}^{\cdot}$ indicate negatively charged (with respect to the crystal lattice) Tl vacancies and positively charged Br vacancies, respectively, in Kröger-Vink notation. When a bias is applied to the TlBr crystal, the migration of the charged vacancies results in an ionic current. The negatively and positively charged ions migrate in opposite directions under the action of the applied electric field. It is generally accepted in the art that the ionic current is dominated by the migration of the Br vacancies, which are more mobile than the Tl vacancies. The resulting imbalance in the distribution of charged vacancies produces an internal electric field that opposes the direction of the applied bias, thereby decreasing the collection of charge carriers and thus degrading the spectroscopic performance, e.g. the signal resolution, of TlBr crystals configured to detect incident radiation.

Accordingly, each of the one or more positively charged dopants may be coupled to a Tl vacancy ($V_{Tl}^{/}$) in the crystal 302 (shown in FIG. 3), and each of the one or more negatively charged dopants may be coupled to a bromide vacancy ($V_{Br}^{\cdot}$) in the crystal 302. As a result of this coupling, each of the positively charged dopants may therefore form a strongly bound, neutral complex with a Ti vacancy, and each of the negatively charged dopants may also form a strongly bound, neutral complex with a Br vacancy, thereby reducing and/or preventing the mobility of Tl and Br vacancies under an applied bias in preferred approaches. In other words, the presence of both positively and negatively charged dopants in the crystal 302 may reduce the ionic conductivity of the crystal at room temperature by effectively neutralizing Tl and Br vacancies and preventing their motion via drift under an applied bias or electric field.

In some approaches, a binding energy between each of the one or more positively charged dopants and a Tl vacancy, and a binding energy between each of the one or more negatively charged dopants and a Br vacancy, may be about three times higher than a binding energy between an intrinsic Tl vacancy and an intrinsic Br vacancy (a Schottky pair).

In additional approaches, the coupled dopant-vacancy pairs may be further coupled into four-defect clusters consisting of a thallium vacancy, a positively charged dopant, a bromine vacancy, and a negatively charged dopant.

In one embodiment, each of the one or more positively charged dopants may comprise at least one extra valence electron relative to Tl, such that the positively charged dopant comprises a positive defect when incorporated on the Tl sites in the crystal 302. For example, in preferred approaches, the one or more positively charged dopants may comprise lead (Pb), which has one extra electron relative to Tl. Other elements belonging to the same group in the periodic table as Pb are natural candidates to also be positively charged dopants in TlBr.

According to another embodiment, each of the one or more negatively charged dopants may comprise at least one less valence electron relative to Br, such that the negatively charged dopant comprises a negative defect when incorporated on the Br sites in the crystal 302. For instance, in preferred approaches, the one or more negatively charged dopants may comprise at least one of selenium (Se), sulfur (S), and tellurium (Te), each of which have one less valence electron relative to Br.

According to another exemplary embodiment, the one or more positively charged dopants and the one or more negatively charged dopants present in the crystal 302 may alter and/or compensate for the effects of extrinsic defects. Extrinsic defects may include dopants intentionally incorporated into the crystal (e.g. the positively and negatively charged dopants disclosed herein), as well as dopants unintentionally incorporated into the crystal, for example, during the formation of the crystal via a known technique. For clarity, dopants unintentionally incorporated into the crystal may be referred to, herein, as "unintentional impurities." Incorporation of charged unintentional impurities into a TlBr crystal will induce the formation of oppositely charged extrinsic Tl or Br vacancies, which may enhance the ionic current and therefor exacerbate the polarization effect. Accordingly, the one or more positively charged dopants and the one or more negatively charged dopants may be present in an effective amount in the crystal (as shown in FIG. 3) to neutralize (e.g. form stable, neutral complexes with) intrinsic and extrinsic Tl and Br vacancies, thus preventing their motion and reducing and/or eliminating the ionic conductivity of the crystal 302.

According to yet another exemplary embodiment, the one or more positively charged dopants and the one or more negatively charged dopants present in the crystal 302 may not alter one or more electronic properties of the crystal 302. For example, in preferred approaches, the presence of the one or more positively charged dopants and the one or more negatively charged dopants in the crystal 302 may not reduce the charge carrier lifetime of the crystal 302. Stated another way, in such preferred approaches, the presence of the one or more positively charged dopants and the one or more negatively charged dopants present in the crystal 302 may introduce substantially few and/or no deep level states in the band gap of the crystal 302.

In additional approaches, the presence of the one or more positively charged dopants and the one or more negatively charged dopants in the crystal 302 may not reduce the mobility of the charge carriers (e.g. electrons or holes) in the crystal 302. In general, charge carrier mobility in a semiconductor crystal may be limited by phonon scattering. Extrinsic defects, including dopants intentionally and/or unintentionally incorporated into a semiconductor crystal, may further induce scattering of the charge carriers. However, in preferred approaches, the one or more positively charged dopants and the one or more negatively charged dopants present in the crystal 302 may introduce no, or substantially minimal, scattering of the charge carriers relative to the unavoidable phonon scattering. In other words, scattering introduced by co-dopants (the positively and negatively charged dopants) may be about equal to scattering from native defects.

In further embodiments, a concentration of the one or more positively charged dopants in the crystal may be between about $10^{15}/cm^3$ to about $10^{18}/cm^3$, and/or a concentration of the one or more negatively charged dopants in the crystal 302 may be between about $10^{15}/cm^3$ to about $10^{18}/cm^3$. In more embodiments, a concentration of the one or more positively charged dopants in the crystal 302 may be comparable (e.g. about equal to) or equal to a concentration of the one or more negatively charged dopants in the crystal.

In still more embodiments, a concentration of the one or more positively charged dopants and a concentration of the one or more negatively charged dopants in the crystal may be based on the number of intrinsic and/or extrinsic Tl and Br vacancies present in the crystal. For example, the one or more positively charged dopants may be present in the crystal in an amount necessary to couple/bind a desired amount (e.g. some, substantially all, all, etc.) of the intrinsic and/or extrinsic Tl vacancies. Similarly, a concentration of the one or more negatively charged dopants may be present in the crystal in an amount necessary to couple/bind a desired amount (e.g. less than a majority, a majority, substantially all, all, etc.) of the intrinsic and/or extrinsic Br vacancies.

In still more embodiments, a concentration of the one or more positively charged dopants and a concentration of the one or more negatively charged dopants in the crystal may be based on the number of unintentional impurities present in the crystal, insomuch as they impart an excess concentration of Tl vacancies and/or Br vacancies. In such cases, the concentration of the one or more positively charged dopants and of the one or more negatively charged dopants may be chosen as described in the paragraph directly above.

Figure 4:
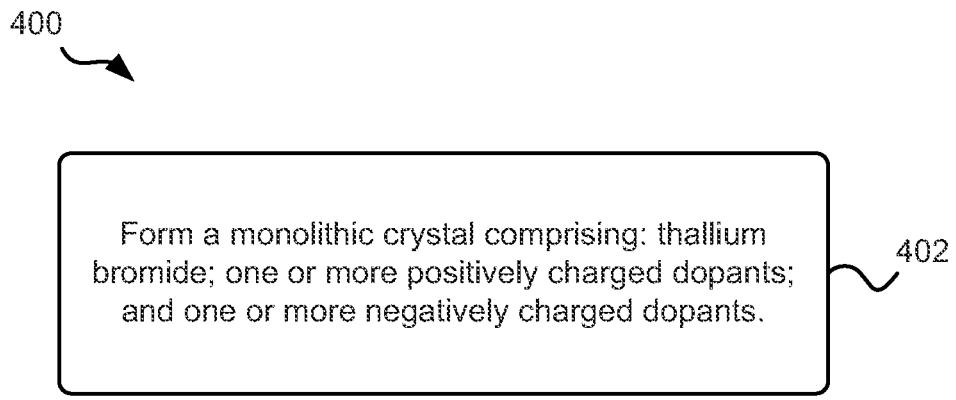
FIG. 4 shows a method, according to one embodiment.

Referring now to FIG. 4, a method 400 is shown according to one embodiment. As an option, the present method 400 may be implemented in conjunction with features from any other embodiment listed herein, such as those described with reference to the other FIGS. Of course, such a method 400 and others presented herein may be used in various applications and/or in permutations, which may or may not be specifically described in the illustrative embodiments listed herein. Moreover, more or less operations than those shown in FIG. 4 may be included in method 400, according to various embodiments. Furthermore, while exemplary reaction techniques and/or reaction conditions are presented, other known reaction techniques and/or suitable reaction conditions may be used for various steps.

As shown in FIG. 4, the method 400 includes forming a monolithic crystal comprising thallium bromide; one or more positively charged dopants; and one or more negatively charged dopants. See operation 402.

In some approaches, the one or more positively charged dopants may be lead (Pb). In more approaches, the one or more negatively charged dopants may be selected from a group consisting of: selenium (Se), sulfur (S), tellurium (Te), and a combination thereof. In preferred approaches, the one or more negatively charged dopants may include at least one of: selenium (Se) and sulfur (S). As noted previously, while Te may be effective in reducing ionic current in the crystal, Te may also impart inferior electronic properties to the crystal, which may render radiation detection relatively less effective.

In various approaches, the monolithic crystal may be formed via suitable crystal growing processes known in the art. For example, suitable crystal growing processes may include, but are not limited to, a Czochralski process, a Bridgman process (e.g. a vertical Bridgman process), a Stockbarger process, a Bridgman-Stockbarger process, a zone refining process, etc. and other such processes as would be understood by one having skill in the art upon reading the present disclosure.

Figure 5:
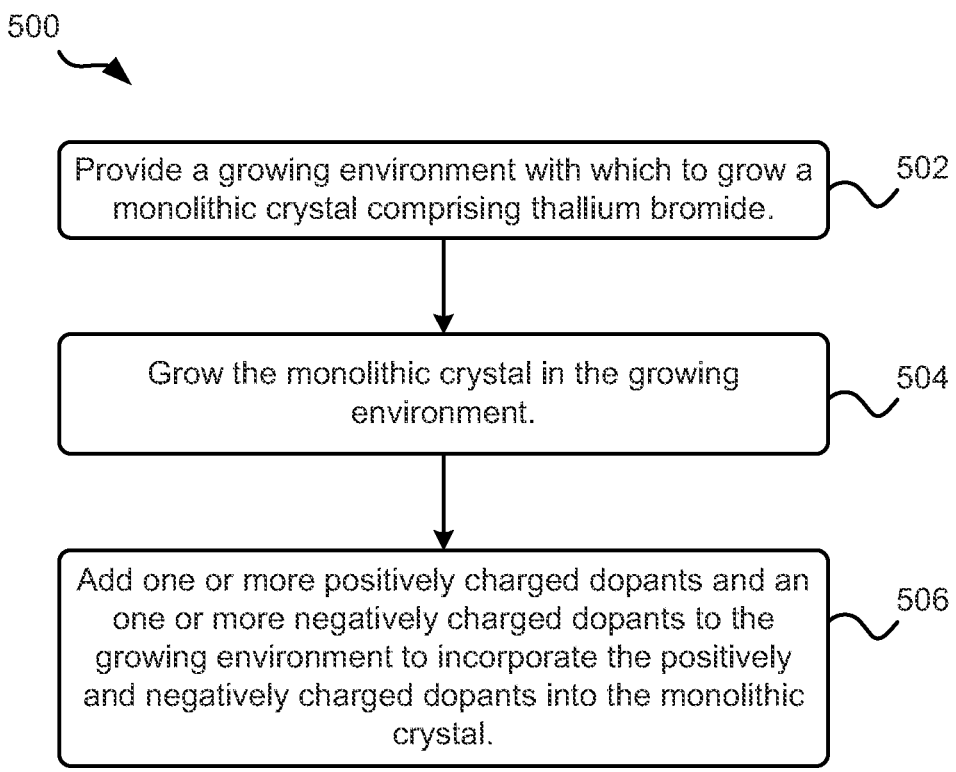
FIG. 5 shows a method for forming a monolithic crystal comprising thallium bromide, according to one embodiment

Referring now to FIG. 5, a method 500 for forming a monolithic crystal comprising thallium bromide is shown according to one embodiment. As an option, the present method 500 may be implemented in conjunction with features from any other embodiment listed herein, such as those described with reference to the other FIGS. Of course, such a method 500 and others presented herein may be used in various applications and/or in permutations, which may or may not be specifically described in the illustrative embodiments listed herein. Moreover, more or less operations than those shown in FIG. 5 may be included in method 500, according to various embodiments. Furthermore, while exemplary reaction techniques and/or reaction conditions are presented, other known reaction techniques and/or suitable reaction conditions may be used for various steps.

As shown in FIG. 5, the method includes providing a growing environment with which to grow a monolithic crystal comprising thallium bromide. See operation 502. In some approaches, the growing environment may include a growing apparatus with which a crystal is grown over a period of time. The growing apparatus may be included in a chamber in which the growing conditions of the monolithic crystal may be controlled, in more approaches. For example, some conditions that may be controlled include, but are not limited to: temperature, humidity, pressure, gases surrounding the crystal, materials in the growing chamber, etc.

In further approaches, the growing environment may include at least one inert gas, such as argon (Ar), helium (He), neon (Ne), krypton (Kr), xenon (Xe), etc.

As also shown in FIG. 5, the method 500 includes growing the monolithic crystal in the growing environment. See operation 504. In various approaches, growing the monolithic crystal in the growing environment may involve a process selected from the group consisting of a Czochralski process, a Bridgman process, a Stockbarger process, a Bridgman-Stockbarger process, and a zone refining process.

The method 500 additionally includes adding one or more positively charged dopants and one or more negatively charged dopants to the growing environment to incorporate the positively and negatively charged dopants into the monolithic crystal. See operation 506.

In some approaches, selection of the one or more positively charged dopants and the one or more negatively charged dopants added to the growing environment, and ultimately incorporated into the monolithic crystal, may be based on several factors.

These factors may include, but are not limited to: donor/acceptor selection to compensate for impurities in the material, a lack of deep levels, weak scattering property of the dopant, solubility of the dopant, how strongly they bind with the vacancies etc.

In various approaches, the one or more positively charged dopants may be lead (Pb), and the one or more negatively charged dopants may be selected from a group consisting of: selenium, sulfur, and a combination thereof.

In other approaches, the one or more positively charged dopants and the one or more negatively charged dopants may be added to the growing environment, and ultimately incorporated into the monolithic crystal, to alter or maintain one or more desired characteristics (e.g. ionic conductivity, charge carrier lifetime, charge carrier mobility, presence or absence of deep intra-gap levels, scattering properties, etc.) of the resulting monolithic crystal. For instance, the incorporation of suitable co-dopants (e.g. the one or more positively charged dopants and the one or more negatively charged dopants) may be used to alter and/or compensate for the effects of intrinsic defects (Schottky defects) and/or extrinsic defects (particularly unintentional impurities) that may be introduced during the crystal growing process.

Specifically, incorporation of the one or more positively charged dopants and the one or more negatively charged dopants in the monolithic crystal may reduce and/or eliminate the ionic conductivity of the monolithic crystal, and/or maintain, increase or (at the very least) not decrease the charge carrier lifetime and/or the charge carrier mobility in the monolithic crystal, in preferred approaches.

In additional approaches, the one or more positively charged dopants and the one or more negatively charged dopants may be added to the growing environment and ultimately incorporated into the monolithic crystal in an effective amount to alter and/or maintain one or more characteristics (e.g. ionic conductivity, charge carrier lifetime, charge carrier mobility, presence or absence of deep intra-gap levels, scattering properties, etc.) of the monolithic crystal.

In one approach, an amount of the positively charged dopants and the one or more negatively charged dopants added to the growing environment and ultimately incorporated into the monolithic crystal may depend on the concentration of intrinsic Tl and Br vacancies in the monolithic crystal, the concentration of unintentional impurities (and resulting extrinsic Tl and Br vacancies) in the monolithic crystal, etc. For example, in some embodiments, the positively charged dopants may be added to growing environment and incorporated into the monolithic crystal in an amount necessary to couple/bind all, or substantially all, the intrinsic and extrinsic Tl vacancies present in the monolithic crystal. Likewise, the negatively charged dopants may be added to growing environment and incorporated into the monolithic crystal in an amount necessary to couple/bind all, or substantially all, the intrinsic and extrinsic Br vacancies present in the monolithic crystal.

In more approaches, the one or more positively charged dopants and the one or more negatively charged dopants may be added to growing environment and incorporated into the monolithic crystal in amounts necessary to prevent an excess of unbalanced charge (e.g. more positive charges relative to negative charges, and vice versa) in the crystal.

In further approaches, a concentration of the one or more positively charged dopants in the monolithic crystal may be between about $10^{15}$ positively charged dopants/cm$^3$ to about $10^{18}$ positively charged dopants/cm$^3$, and/or a concentration of the one or more negatively charged dopants in the crystal may be between about $10^{15}$ negatively charged dopants/cm$^3$ to about $10^{18}$ negatively charged dopants/cm$^3$.

Any of the methods, systems, devices, crystals, etc. described herein, taken individually or in combination, in whole or in part, may be included in or used to make one or more systems, structures, etc. In addition, any of the features presented herein may be combined in any combination to create various embodiments, any of which fall within the scope of the present invention.

Applications and Uses

Illustrative uses of various embodiments of the present invention include, but are not limited to, applications requiring radiation detection. For example, in some approaches, the crystals described herein (e.g. comprising TlBr, one or more positively charged dopants, and one or more negatively charged dopants) may be used to detect x-rays, gamma rays, and/or other ionizing radiation from a source. The detection may be performed spectroscopically with high energy resolution, while operating at ambient temperatures. Like similar detectors fabricated from other active materials, the device may be configured to also give spatial resolution. Such detectors find use in medical diagnostics as x-ray detectors, PET detectors, etc., in homeland security and nonproliferation applications as detectors of illicit radiological and nuclear material, in space imaging applications, and other radiation detection and imaging applications including instrument diagnostics, etc. The high energy resolution spectroscopic detection ability at ambient temperatures is particularly suited for use in relatively low-cost field-capable detectors for nuclear nonproliferation and interdiction applications. These devices may be used at ports, airports, shipping yards, mobile applications, etc., to detect the presence of nuclear materials in obscured packaging and/or shipping containers.

In other approaches, the process described herein may be used for optimizing mixed ionic/electronic conductors by simultaneously and independently enhancing or reducing these conductivities as appropriate for various applications in radiation detectors, transistors, light emitting diodes, fuel cells, battery components, and other such semiconductor/electrochemical devices as would be understood by one having skill in the art upon reading the present disclosure.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A crystal, comprising:
   thallium bromide (TlBr);
   one or more positively charged dopants; and
   one or more negatively charged dopants,
   wherein a concentration of the one or more positively charged dopants is about equal to a concentration of the one or more negatively charged dopants.

2. The crystal as recited in claim 1, wherein the one or more positively charged dopants comprise lead (Pb).

3. The crystal as recited in claim 1, wherein the one or more negatively charged dopants are selected from a group consisting of: selenium, sulfur, and a combination thereof.

4. The crystal as recited in claim 1, wherein the concentration of the one or more positively charged dopants in the crystal is between about $10^{15}$/cm$^3$ to about $10^{18}$/cm$^3$.

5. The crystal as recited in claim 1, wherein the concentration of the one or more charged dopants in the crystal is between about $10^{15}$/cm$^3$ to about $10^{18}$/cm$^3$.

6. The crystal as recited in claim 1, wherein each positively charged dopant is coupled to a thallium vacancy in the crystal, and each negatively charged dopant is coupled to a bromide vacancy in the crystal.

7. The crystal as recited in claim 6, wherein a positively charged dopant-thallium vacancy pair and a negatively charged dopant-bromide vacancy pair are coupled to form a four-defect cluster consisting of the thallium vacancy, the positively charged dopant, the bromide vacancy, and the negatively charged dopant.

8. The crystal as recited in claim 1, wherein at least one of the one or more negatively charged dopants is tellurium.

9. A system, comprising:
   a monolithic crystal comprising:
      thallium bromide (TlBr),
      a plurality of positively charged dopants, each positively charged dopant being coupled to a thallium vacancy in the monolithic crystal thereby forming a positively charged dopant-thallium vacancy pair, and
      a plurality of negatively charged dopants, each negatively charged dopant being coupled to a bromide vacancy in the monolithic crystal thereby forming a negatively charged dopant-bromide vacancy pair,
      wherein a total concentration of the plurality of positively charged dopants is about equal to a total concentration of the plurality of negatively charged dopants; and
   a detector, wherein the detector is configured to detect a signal response of the crystal.

10. The system as recited in claim 9, wherein at least one of the one or more positively charged dopants consist of lead (Pb).

11. The system as recited in claim 9, wherein at least one of the negatively charged dopants is selenium and at least one of the negatively charged dopants is sulfur.

12. The system as recited in claim 9, wherein the total concentration of the one or more positively charged dopants in the crystal is between about $10^{15}/cm^3$ to about $10^{18}/cm^3$.

13. The system as recited in claim 9, wherein the crystal has a volume of at least about 1 cm³,
    wherein one of the positively charged dopant-thallium vacancy pairs and one of the negatively charged dopant-bromide vacancy pairs are coupled to form a four-defect cluster consisting of the thallium vacancy, the positively charged dopant, the bromide vacancy, and the negatively charged dopant.

14. The system as recited in claim 9, wherein at least one of the negatively charged dopants is tellurium.

15. The system as recited in claim 9, wherein the crystal maintains an energy resolution of less than about 1% at 662 keV for about several months.

16. The system as recited in claim 9, further comprising:
    a first electrode coupled to a first region of the monolithic crystal; and
    a second electrode coupled to a second region of the monolithic crystal.

17. A method, comprising:
    forming a monolithic crystal comprising:
       thallium bromide;
       one or more positively charged dopants; and
       one or more negatively charged dopants,
    wherein forming the crystal comprises:
       providing a growing environment in which to grow the monolithic crystal;
       growing the monolithic crystal in the growing environment; and
       adding equal amounts of the positively charged dopants and the negatively charged dopants to the growing environment to incorporate the positively and negatively charged dopants into the monolithic crystal.

18. The method as recited in claim 17,
    wherein a concentration of the one or more positively charged dopants in the monolithic crystal is between about $10^{15}/cm^3$ to about $10^{18}/cm^3$, and wherein a concentration of the one or more negatively charged dopants in the monolithic crystal is between about $10^{15}/cm^3$ to about $10^{18}/cm^3$.

19. The method as recited in claim 17, wherein the monolithic crystal is grown via a process selected from a group consisting of: a Czochralski process, a Stockbarger process, and a zone refining process.

20. The method as recited in claim 17, wherein incorporating the one or more positively charged dopants and the one or more negatively charged dopants into the monolithic crystal does not introduce deep levels in a band gap of the monolithic crystal.

* * * * *